United States Patent [19]

Nakano et al.

[11] 4,038,084

[45] July 26, 1977

[54] PHOTO-SETTING COMPOSITION

[75] Inventors: Tsunetomo Nakano; Kazuaki Nishio; Toshikazu Hayashi; Hiroshi Andou, all of Ichihara, Japan

[73] Assignee: UBE Industries, Ltd., Ube, Japan

[21] Appl. No.: 669,839

[22] Filed: Mar. 24, 1976

[30] Foreign Application Priority Data

Apr. 8, 1975 Japan .................................. 50-41790

[51] Int. Cl.$^2$ .............................................. G03G 1/68
[52] U.S. Cl. ................................. 96/115 P; 96/35.1; 96/86 P; 204/159.22
[58] Field of Search ..................... 96/115, 115 P, 35.1; 204/159.22

[56] References Cited

U.S. PATENT DOCUMENTS 3,676,145  7/1972  Protzman ........................... 96/115 R

FOREIGN PATENT DOCUMENTS 50-73944  1975  Japan

OTHER PUBLICATIONS

Chemical Absts. vol. 83, col. 106241h (1975).

*Primary Examiner*—John D. Welsh
*Attorney, Agent, or Firm*—Flynn & Frishauf

[57] ABSTRACT

A photo-setting composition essentially consisting of:

(A) 100 weight parts of a product prepared by esterifying a maleic anhydride adduct of a liquid polybutadiene with a hydroxyl compound;

(B) 10 – 150 weight parts of one or more than one kind of unsaturated compound selected from the group consisting of a hydroxyl compound identified above, a di(meth)acrylate compound and a glycidyl monoester compound; and (C) 0.5 – 10 weight parts of a benzoinether compound.

10 Claims, No Drawings

PHOTO-SETTING COMPOSITION

This invention relates to a photo-setting composition. Particularly, this invention relates to a photo-setting composition especially useful for forming printing reliefs through photo-radiation.

Heretofore, a photo-setting composition comprising a maleic anhydride adduct of a liquid polybutadiene, di(meth)acrylic acid ester and a photo-sensitizer have been known, as disclosed, for instance, in Japanese Patent Provisional Publication No: 73944/75. Yet, such a composition seems to have some drawbacks such that the relief formed from this composition has low tensile strength. The said tensile strength can be creased by varying the ratio of the components of the composition. In this instance, however, the photo-setting time is prolonged and moreover the resolving power, elongation and/or hardness which are of importance in the characteristics of reliefs are apt to deteriorate, and hence the reliefs so obtained are not appropriate for printing.

We have made studies on photo-setting compositions which would form a photo-set product having high tensile strength and no drawbacks mentioned above and thus attained this invention.

Accordingly, an object of this invention is to provide a photo-setting composition, which is especially useful for forming printing reliefs having satisfactory characteristics.

Another object is to provide a photo-setting composition, photo-setting time of which is satisfactorily short.

A further object is to provide a relief having high tensile strength, high resolving power and appropriate hardness and elongation.

A still further object is to provide a process for preparing reliefs of excellent characteristics.

Other objects will be seen from the content of this specification.

This invention is specifically concerned with a photo-setting composition consisting essentiallly of:

A. 100 weight parts of a product prepared by esterifying a maleic anhydride adduct of a liquid polybutadiene with a hydroxyl compound having the formula

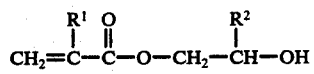

in which $R^1$ and $R^2$ are the same or different and each represents hydrogen or methyl;

B. 10 – 150 weight parts of one or more than one kind of unsaturated compound selected from the group consisting of the hydroxyl compound identified above,
a di(meth)acrylate compound having the formula

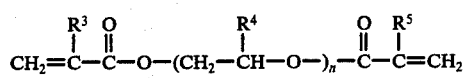

in which $R^3$, $R^4$ and $R^5$ are the same or different and each represents hydrogen or methyl, and $n$ is an integer of 1 – 4 and
a glycidyl monoester compound having the formula

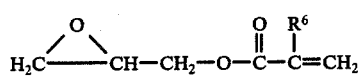

in which $R^6$ represents hydrogen or methyl;

C. 0.5 – 10 weight parts of a benzoinether compound having the formula

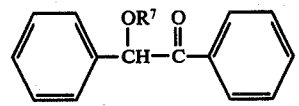

in which $R^7$ represents an alkyl group containing 1 – 3 carbon atoms.

The composition provided by this invention is a transparent liquid and soluble in water prior to photo-setting, but after radiation of light is applied to the composition, the said composition is photo-set to become a water-insoluble product. The photo-setting time of this composition is satisfactorily short, and a printing relief formed from the present composition is high in both resolving power and tensile strength and appropriate in both elongation and hardness. Therefore, the product obtained from the present composition is considered as having excellent characteristics.

A relief obtained from the photo-setting composition of this invention has a 50 – 80 hardness (Shore hardness D) upon photo-setting, 5 – 40% elongation, not less than 10.0 line/mm resolving power (the value obtained by the method mentioned hereinafter, using Test Chart No. 1 (available from Society of Electrophotography, Japan)) and not less than 80 Kg/cm² tensile strength. In addition, the photo-setting time of the composition of this invention is within 200 seconds.

Component (A) of the present composition is a product prepared by esterifying a maleic anhydride adduct of a liquid polybutadiene with a hydroxyl compound having the formula

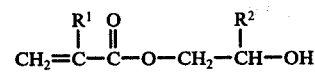

in which $R^1$ and $R^2$ are the same or different and each represents hydrogen or methyl.

The said liquid polybutadiene has 500 – 5,000, preferably 700 – 3,000, molecular weight and 200 – 10,000 CP (centipoise), preferably 500 – 5,000 CP, viscosity at 30° C. Microstructure of the liquid polybutadiene used is not limited. The liquid polybutadiene may contain as the terminal group a functional group such as hydroxyl, carboxyl, amino, etc. The liquid polybutadiene mentioned in the specification and claims of this application includes homopolymers of butadiene and copolymers of butadiene with acrylonitrile, styrene, acrylic acid ester, methacrylic acid ester and the like, in which the butadiene units are over 70% of the entire units of the copolymer.

The maleic anhydride adduct of a liquid polybutadiene may be prepared by reacting a liquid polybutadiene with maleic anhydride in an organic solvent in the presence or absence of a catalyst at 100° – 190° C for more than several hours. Such methods are disclosed, for instance, in W. Crouch, Industrial Engineering Chemistry, 47, 2095 (1955) and in Japanese Patent Publication No. 954/71. The resulting maleic anhydride adduct of a liquid polybutadiene desirably has a 120 – 250, more preferably 140 – 220, acid value and from 1,000 CP to grease degree, more preferably 2,000 – 100,000 CP, viscosity at 50° C.

The hydroxyl compound having the formula

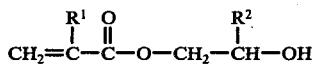

in which $R^1$ and $R^2$ have the same meanings as defined above, which is employed for esterifying the above-obtained maleic acid adduct of a liquid polybutadiene is exemplified by 2-hydroxyethyl methacrylate, 2-hydroxyethyl acrylate, 2-hydroxypropyl methacrylate and 2-hydroxypropyl acrylate. The esterification can be carried out by a known method, and especially the following method is desirable: 100 Weight parts of a maleic acid adduct of a liquid polybutadiene and not less than 20 weight parts of a hydroxyl compound are mixed, and, if necessary, at least one kind of appropriate organic solvent, especially such as an unsaturated compound to be used as Component (B) of this invention is added. The mixture is then reacted at 50° – 150° C, preferably 60° – 90° C, over 5 hours. In the aforementioned esterification reaction, at least one kind of a catalyst selected from the group consisting of a tertiary amine, a secondary amine, a hydrogen halide salt of a secondary amine and an organic quaternary ammonium salt can be used. The esterification reaction is continued until IR peaks (1760 cm$^{-1}$ and 1810 cm$^{-1}$) corresponding to the absorption peaks of the maleic anhydride ring contained in the maleic acid adduct of a liquid polybutadiene disappear.

As Component (A) of the present composition, an esterified product which is colorless, contains no gel and has 200 – 100,000 CP viscosity at 30° C is preferably used.

Component (B) of the present composition is one or more than one kind of unsaturated compounds selected from the group consisting of:

a hydroxyl compound having the formula

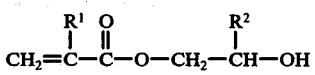

a di(meth)acrylate compound having the formula

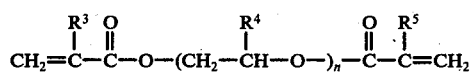

and a glycidyl monoester compound having the formula

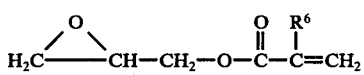

In the above formulae, $R^1$, $R^2$, $R^3$, $R^4$, $R^5$ and $R^6$ have the same meanings as defined hereinbefore.

A hydroxyl compound identified above may be the same as the hydroxyl compound employed in forming the esterified product of Component (A).

A di(meth)acrylate compound may be exemplified by ethyleneglycol dimethacrylate, ethyleneglycol diacrylate, diethyleneglycol dimethacrylate, diethyleneglycol diacrylate, triethyleneglycol dimethacrylate, triethyleneglycol diacrylate, tetraethyleneglycol dimethacrylate, tetraethyleneglycol diacrylate, propyleneglycol dimethacrylate, propyleneglycol diacrylate, dipropyleneglycol dimethacrylate, dipropyleneglycol diacrylate, tripropyleneglycol dimethacrylate, tripropyleneglycol diacrylate, tetrapropyleneglycol dimethacrylate and tetrapropyleneglycol diacrylate.

A glycidyl monoester may be glycidyl methacrylate or glycidyl acrylate.

In the present composition, Component (C) is a benzoinether having the formula

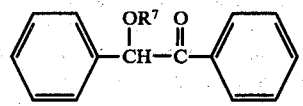

in which $R^7$ has the same meaning as defined hereinbefore, and may be exemplified by benzoin methyl ether, benzoin ethyl ether, benzoin propyl ether and benzoin isopropyl ether.

In the present composition, an unsaturated compound of Component (B) is added in an amount of 10 – 150 weight parts, preferably of 20 – 110 weight parts, per 100 weight parts of an esterified product of Component (A). If the amount of an unsaturated compound is below the lowest limit of the abovementioned range, the photo-setting time of the composition is prolonged and the resulting product has low hardness and low tensile strength. Thus, it is not appropriate for the purpose of this invention. If the amount is above the upper limit, 150 weight parts, the resulting product becomes so dense in the crosslinking structure upon photo-setting that the hardness may increase beyond its requirement. Thus, the product so obtained has low elongation ratio and flexibility, and for this reason it is not suitable for printing reliefs.

A benzoinether compound of Component (C) is added in an amount of 0.5 – 10 weight parts, preferably of 1 – 7 weight parts, per 100 weight parts of an esterified product of Component (A). If the amount of a benzoinether compound is below the lowest limit, 0.5 weight part, the product is not suitable due to lowerings of the hardness and the resolving power. If the amount is above the upper limit, 10 weight parts, the photo-setting time of the composition is prolonged, the resulting product has low hardness, and the composition gets substantially colored upon addition of the excess amount of benzoinether.

A benzoinether compound of Component (C) is preferably added in an amount of not more than 50 weight parts per 100 weight parts of an unsaturated compound of Component (B). If the amount of Component (C) is above the upper limit, the photo-setting time is prolonged.

The composition of the present invention is superior in heat stability to photo-setting compositions comprising known unsaturated polyester resins. That is, the present composition is stable when subjected to a temperature below 100° C. Then, there is obtained an excellent relief containing little crosslinking caused by heating, because the composition is not affected by either thermic rays in the light or heat generated by the photo-setting reaction, even if no thermopolymerization stabilizer is added. Yet, if necessary, the upper limit of the temperature at which the composition is still stable may reach 150° C by way of adding an appropriate amount of a thermopolymerization stabilizer. For instance, a stabilizer such as hydroquinone, p-benzoquinone and α-naphthylamine may be added in an amount of 0.005 – 1 weight part per 100 weight parts of Component (A), which is the esterified product. Nevertheless, if such a thermopolymerization stabilizer is added, the photo-setting time is prolonged. Hence, no stabilizer is preferably added, so far as the imperative necessities do not arise. Or, if inevitable, the amount of the stabilizer should be as small as possible.

The blending of the components of the present composition may be carried out in a conventional manner. In other words, components (A), (B) and (C) may be mixed in an arbitrary order.

Since, the di(meth)acrylate compound and the glycidyl monoester compound of the unsaturated compounds (Component (B)) are almost inactive in the aforementioned esterification process, these may be added to a mixture of unreacted ingredients forming Component (A) in advance of the esterification reaction for preparing Component (A). Then, when the photo-setting composition is to be prepared, only a benzoinether compound is added to the mixture of the unsaturated compound and an esterified product produced upon esterification. Or, to the mixture are added a benzoinether compound and an additional unsaturated compound.

If the hydroxyl compound is used as Component (B), it may be added in more than the required amount to a mixture of the ingredients forming Component (A) in advance of the esterification. Then, when the photo-setting composition is to be prepared, only a benzoinether compound is added to the mixture of the esterified product and an unreacted hydroxyl compound. Or, to the latter are added a benzoinether compound and an additional unsaturated compound.

The above-stated procedures are planned based on the following: If either the di(meth)acrylate compound or the glycidyl monoester compound is employed, as described above, as a solvent for the esterification, or if more than the required amount of the hydroxyl compound is employed for the same purpose as above, the employed di(meth)acrylate compound or glycidyl monoester compound or the unreacted hydroxyl compound which is present with the esterified product of Component (A) may serve as Component (B). Therefore, only a benzoinether compound is added to the mixture to prepare the photo-setting composition of this invention.

The composition of this invention preferably has 200 - 60,000 CP viscosity at 30° C.

The composition of this invention is a colorless and transparent liquid, and the photo-setting time of the composition is within 200 seconds according to measurement made by the method stated hereinafter. Therefore, a printing relief can be prepared by radiation of light to this composition for a rather short period. Processes for preparing such printing reliefs may be exemplified as follows:

To begin with, a composition of this invention is placed in the form of a layer of a thickness of 0.1 - 6 mm on a supporting plate, which may be exemplified by sheets of metals such as iron, stainless steel, zinc and aluminum, sheets of rubbers such as natural rubber and synthetic rubber and sheets of resins such as celluolid, polyester, polyvinyl chloride, polyvinylidene chloride, polyethylene, polypropylene and polyethylene terephthalate. Subsequently, a transparent film is placed on the composition layer, and on the film is placed a negative film. To this is radiated light of 250 - 400 m$\mu$ substantially by means of an appropriate light source, for instance, Chemical Lamp and high pressure or low pressure mercury lamps. If the supporting plate is transparent and if desired, the radiation is also made for a short period from the back side of the plate so as to sufficiently fix the photo-set product onto the plate.

The portions of the composition which have not been photo-set are then dissolved off by treating the resulting sheets with an aqueous solution of sodium or potassium hydroxide or a polar solvent such as water, alcohol and acetone. The photo-set relief thus obtained is dried and, if necessary, receives further radiation (post-exposure). Thus, a relief is prepared. The period of time of the radiation needed for the preparation of the relief varies depending upon the nature of each Component, the ratio of Components admixed, the thickness of the composition layer, strength of the light, nature of the light source and the photo-setting temperature. If a composition layer of this invention having a thickness of 1 mm is photo-set by a 20-W Chemical Lamp located 10 cm apart from the composition layer, the photo-radiation time for radiating through a negative film is about 4 minutes, and the whole photo-radiation time including the time required for post-exposure is within 10 minutes.

Alternatively, a composition which is not placed on a supporting plate may receive radiation through a negative film. In this case, further radiation from the back side is made for a short time to the whole surface of the composition sheet in advance of treating it with a dissolving medium so as to photo-set the bottom layer of the composition which will serve as a supporting plate. A variety of the conventional methods may be adopted to photo-set the composition of this invention to prepare a relief. The relief so obtained may be used as such as an original plate for printing which is fixed onto the plate cylinder of a printing machine to work.

A photo-set product prepared by radiation of light to a composition of this invention has excellent characteristics such as 50 - 80 hardness (Shore hardness D, according to the measurement method described hereinafter), not less than 10.0 line/mm resolving power, 5 - 40% elongation and not less than 80 Kg/cm$^2$ tensile strength. Further, the product is satisfactory in anti-swelling property against an organic solvent such as acetone, benzene, toluene, alcohol and an acetic acid ester and also satisfactory in affinity for an ink and in ink-transferring property onto pulp papers and synthetic papers such as films of polyethylene, polystyrene and polypropylene. Hence, the said product is advantageously used for reliefs.

The composition of this invention may be widely used for preparing paints, adhesives, displays, lenses and the like, in addition to the use for a printing relief.

The present invention will be further illustrated by the following examples, comparative examples and reference examples. Yet, these examples are not understood to limit the present invention.

In the examples and comparative examples, the photosetting time is expressed by the period of time in seconds from the beginning of the radiation until the time when the lower surface of the composition became non-sticking to a tissue paper which was pressed by hand against a composition layer having a thickness of 1 mm, after confirming that the composition layer had no fluidity. The radiation was made by using a 20-W Chemical Lamp (available from Tokyo Shibaura Electric Co., Ltd., being sold under the name FL20BL) which was placed 10 cm apart from the upper surface of the composition layer.

Test pieces for determination of hardness, tensile strength and elongation were prepared as follows.

On a glass plate of a thickness of 3 mm (a glass plate sold by Mitamura Riken Kogyo Co., Ltd. for thin layer chromatography purpose) placed horizontally was put a polyvinylidene chloride film of a thickness of 10 μ (available from Asahi Dow Co., Ltd. Trademark Saranwrap). On the sheets so obtained was placed a mold made of polybutadiene rubber having 5 cm x 10 cm inner size, 1 mm height and 1 cm mold wall thickness. Then, in the area confined by the mold and the film was formed a composition layer by filling the composition therein. Further, a polyester film of a thickness of 100 μ (available from Toray Industries Inc., Trade mark, Lumirar Film) was put on the composition layer. A glass plate like the above-mentioned one was next placed on the polyester film. Both sides of the composition layer thus prepared received radiation of light for 4 minutes from a couple of the 20-W Chemical Lamps mentioned above located 10 cm apart from the each surface of the layer. The so photo-set product sheet was removed from the mold to determine the hardness, tensile strength and elongation thereof.

The hardness (Shore hardness D) was determined by employing a pile of a couple of the above-obtained sheets which were then measured by means of Durometer D Type (available from Toyo Seiki Seisakusho Co., Ltd.). The tensile strength was determined by tensile strength measurement according to JIS (Japanese Industrial Standard) K-6301, employing a No. 3 dumb-bell made of the above-photoset sheet and adopting 5 mm/minutes pulling rate. The elongation was judged from the length where the test piece was broken and is expressed by 100 per cent ratio of the length elongated as against the original length of the test piece.

The resolving power was determined as follows: On the glass plate like the one mentioned above was placed a negative film of the same size prepared according to the parallel resolving power measurement pattern (Test Chart No. 1 available from Society of Electrophotography, Japan). Then, a polyvinylidine chloride film like the one mentioned above was put over the negative film, and subsequently a rubber-made mold having 5 cm x 10 cm inner size, 0.5 mm height and 1 cm mold wall thickness was placed thereon. In the area confined by the mold and the film was filled the composition to form a composition layer. Over the composition layer was placed a polyester film like the one mentioned above. To the back side of the plate was radiated at 30° C for 200 seconds the light from a 20-W Chemical Lamp located 5 cm below the back surface of the plate. To the upper surface of the plate was radiated for 20 seconds light from the said Chemical Lamp located 10 cm above the upper surface of the plate. The photo-set composition was then removed from the mold, and unreacted portions were washed off with an aqueous potassium hydroxide solution over several minutes. The relief obtained was compared by sight with the above-mentioned parallel resolving power measurement pattern to determine the resolving power.

The viscosity was determined by means of a rotation viscometer.

In the following examples, comparative examples and reference examples, abbreviated terms are adopted as follows:

PB maleate:
   a maleic anhydride adduct of a liquid polybutadiene
Esterification:
   an esterification reaction between a maleic anhydride adduct of a liquid polybutadiene and a hydroxyl compound
Esterified product:
   a product obtained by the above esterification reaction.
Mixture produced upon esterification:
   a mixture consisting of an esterified product, an unreacted hydroxyl compound and an unsaturated compound added as a solvent, which is produced upon the above-mentioned esterification.
2HEA: 2-hydroxyethyl acrylate
2HEM: 2-hydroxyethyl methacrylate
2HPM: 2-hydroxypropyl methacrylate
DPDM: dipropyleneglycol dimethacrylate
EDM: ethyleneglycol dimethacrylate
DEDA: diethyleneglycol dimethacrylate
TEDM: triethyleneglycol dimethacrylate
TEEDM: tetraethyleneglycol dimethacrylate
GMA: glycidyl methacrylate

REFERENCE EXAMPLE 1

Preparation of maleic anhydride adduct of liquid polybutadiene

To 400 ml of pseudocumene was added 200 g of a liquid polybutadiene having the molecular weight, viscosity and micro structure values set out in Table 1. Then, maleic anhydride of the amount set out in Table 1 was also added. The solution was reacted by heating at 165°– 170° C for 6 hours in an atmosphere of nitrogen. After completion of the reaction, the solution was cooled. The unreacted maleic anhydride and pseudocumene were both removed by distillation under reduced pressure, leaving a maleic anhydride adduct of the liquid polybutadiene. The acid value, viscosity and yield of the PB maleate (a maleic anhydride adduct of the liquid polybutadiene) so obtained are shown in Table 1.

Table 1

| Experiment | Liquid polybutadiene Micro structure 1,2 | cis-1,4 | trans-1,4 | Molecular weight | Viscosity (CP at 30° C) | Amount of maleic anhydride (g) | PB maleate Acid value | Viscosity (CP at 50° C) | yield (g) |
|---|---|---|---|---|---|---|---|---|---|
| R1-1 | over 90% | — | — | 1,000 | 2,000 | 182 | 153 | 12,000 | 225 |
| R1-2 | 43 | 46% | 11% | 2,500 | 2,300 | 146 | 212 | 77,000 | 239 |
| R1-3 | 1 | 75 | 24 | 1,400 | 700 | 170 | 246 | grease | 248 |
| R1-4 | 1 | 75 | 24 | 1,400 | 700 | 140 | 214 | 75,000 | 240 |
| R1-5 | 1 | 75 | 24 | 1,400 | 700 | 100 | 178 | 54,000 | 230 |

REFERENCE EXAMPLE 2

Preparation of esterified product maleic anhydride adduct of liquid polybutadiene To a PB maleate (maleic anhydride adduct of liquid polybutadiene) set out in Table 2 of the amount set out in Table 2 were added a hydroxyl compound and an unsaturated compound of the amounts set out in Table 2. Further 10 mg of hydroquinone was added to the mixture, except that in R2-6 was employed 110 mg of hydroquinone. The resulting mixture was reacted at 70° C for 20 hours. There was obtained a mixture containing an esterified product of the PB maleate which showed no peaks at 1760 cm$^{-1}$ and 1810 cm$^{-1}$ corresponding to the absorption peaks of a maleic anhydride ring of the PB maleate. The contents and viscosity of the mixture produced upon the esterification reaction are shown in Table 2.

and resolving power of the photo-set product are shown in Table 3.

COMPARATIVE EXAMPLES 1 - 2

To 12 g of a mixture produced upon the esterification of R 2-6 in Reference example 2 no unsaturated compound (comparative example 1) was added or 20 g of DPDM (Comparative example 2) was added. Further, 0.3 g of benzoin methyl ether was added to either mixture. The viscosity and photo-setting time of the com- Table 2

| Experiment | Compounds employed in Esterification | | | | | Mixture produced upon esterification | | | | | |
|---|---|---|---|---|---|---|---|---|---|---|---|
| | *PB maleate (g) | | Hydroxyl compound (g) | | Unsaturated compound (g) | | Esterified product (g) | Unreacted hydroxyl compound (g) | | Unsaturated compound (g) | | Viscosity of mixture (CP at 30° C) |
| R2-1 | R1-1 | 10 | 2HEM | 5 | | 0 | 11.7 | 2HEM | 3.3 | | 0 | 3,350 |
| R2-2 | " | 10 | " | 10 | | 0 | 11.8 | " | 8.2 | | 0 | 900 |
| R2-3 | " | 10 | 2HEA | 5 | | 0 | 11.5 | 2HEA | 3.5 | | 0 | 3,200 |
| R2-4 | " | 10 | 2HPM | 5 | | 0 | 11.9 | 2HPM | 3.1 | | 0 | 3,400 |
| R2-5 | " | 10 | 2HEM | 2.5 | | 0 | 11.7 | 2HEM | 0.8 | | 0 | 8,300 |
| R2-6 | " | 110 | " | 22 | | 0 | 128.9 | " | 3.1 | | 0 | 9,500 |
| R2-7 | " | 10 | " | 2.5 | DPDM | 2.5 | 11.8 | " | 0.7 | DPDM | 2.5 | 4,280 |
| R2-8 | R1-2 | 10 | 2HEA | 5 | | 0 | 12.1 | 2HEA | 2.9 | | 0 | 34,100 |
| R2-9 | " | 10 | 2HPM | 5 | | 0 | 12.6 | 2HPM | 2.4 | | 0 | 34,600 |
| R2-10 | " | 10 | 2HEM | 5 | | 0 | 12.3 | 2HEM | 2.7 | | 0 | 37,000 |
| R2-11 | " | 10 | " | 2.5 | DPDM | 2.5 | 12.4 | " | 0.1 | DPDM | 2.5 | 42,000 |
| R2-12 | R1-3 | 10 | " | 5 | | 0 | 12.7 | " | 2.3 | | 0 | 54,000 |
| R2-13 | R1-4 | 10 | " | 5 | | 0 | 12.4 | " | 2.6 | | 0 | 17,000 |
| R2-14 | R1-5 | 10 | " | 5 | | 0 | 12.0 | " | 3.0 | | 0 | 6,400 |

*PB maleate is identified by the experiment number (Run number) set out in Reference example 1.

EXAMPLES 1 - 22 position and the characteristics of the photoset product are shown in Table 3.

Table 3

| | Photo-setting composition | | Viscosity of composition (CP at 30° C) | Photo-setting time (sec.) | Characteristics of photo-set product | | | |
|---|---|---|---|---|---|---|---|---|
| Example | Mixture produced upon esterification | Unsaturated compound added (g) | | | Tensile strength (Kg/cm²) | elongation (%) | Hardness (D) | Resolving power (line/mm) |
| 1 | R2-1 | 0 | 3,300 | 110 | 140 | 21 | 67 | over 12.5 |
| 2 | R2-2 | 0 | 850 | 110 | 238 | 17 | 77 | " |
| 3 | R2-3 | 0 | 3,150 | 130 | 91 | 24 | 60 | " |
| 4 | R2-4 | 0 | 3,300 | 140 | 113 | 22 | 63 | " |
| 5 | R2-5 | DPDM 2.6 | 4,250 | 120 | 141 | 15 | 65 | " |
| 6 | R2-6 | " 1.2 | 7,500 | 160 | 86 | 20 | 59 | " |
| 7 | " | " 5 | 1,300 | 130 | 164 | 10 | " | " |
| 8 | " | " 8 | 1,050 | 140 | 194 | 8 | 77 | " |
| 9 | " | " 12 | 800 | 130 | 186 | 6 | 79 | " |
| 10 | " | EDM 2.5 | 3,900 | 130 | 101 | 7 | 74 | " |
| 11 | " | DEDA 2.5 | 4,100 | 130 | 107 | 10 | 67 | " |
| 12 | " | TEDM 2.5 | 4,500 | 130 | 101 | 15 | 62 | " |
| 13 | " | TEEDM 2.5 | 4,700 | 130 | 94 | 17 | 60 | " |
| 14 | " | GMA 2.5 | 3,800 | 140 | 87 | 25 | 62 | " |
| 15 | R2-7 | 0 | 4,250 | 125 | 132 | 19 | 63 | " |
| 16 | R2-8 | 0 | 38,850 | 130 | 84 | 16 | 55 | " |
| 17 | R2-9 | 0 | 37,900 | 150 | 105 | 23 | 70 | " |
| 18 | R2-10 | 0 | 39,800 | 110 | 165 | 24 | 53 | " |
| 19 | R2-11 | 0 | 42,500 | 90 | 160 | 26 | 75 | " |
| 20 | R2-12 | 0 | 53,200 | 95 | 121 | 38 | 60 | " |
| 21 | R2-13 | 0 | 16,000 | 95 | 98 | 39 | 58 | " |
| 22 | R2-14 | 0 | 6,200 | 100 | 92 | 37 | 57 | " |
| Comp. 1 | R2-6 | 0 | 8,700 | 160 | 52 | 21 | 50 | 10.0 |
| Comp. 2 | R2-6 | DPDM 19.5 | 700 | 170 | 175 | 2 | 86 | " |

To the whole amount (except in Examples 6 - 14) of the mixture produced upon the esterification in Reference example 2 were added an unsaturated compound of the amount set out in Table 3 and benzoin methyl ether of 0.3 g to prepare a photosetting composition. In Examples 6 - 14, 12 g of the mixture produced upon the esterification of R 2-6 was employed instead. The viscosity and photo-setting time of the composition so obtained and the tensile strength, elongation, hardness

COMPARATIVE EXAMPLES 3 - 7

To 10 g of PB maleate set out in Table 4 were added an unsaturated compound of the amount set out in Table 4, 0.3 g of benzoin methyl ether and 10 mg of hydroquinone so as to prepare a composition. The viscosity and photo-setting time of the composition and the characteristics of the photo-set product are shown in Table 4.

Table 4

| Comp. example | Photo-setting composition | | | Viscosity of composition (Cp at 30° C) | Photo-setting time (sec.) | Characteristics of photo-set product | | | |
|---|---|---|---|---|---|---|---|---|---|
| | **PB maleate | Unsaturated compound added | (g) | | | Tensile strength (Kg/cm²) | elongation (%) | Hardness (D) | Resolving power (line/mm) |
| 3 | R1-1 | 2HEM | 5 | 7,700 | 180 | 2.2 | 8 | 18 | 8.0 |
| 4 | R1-2 | " | 5 | over 100,000 | — | 18 | 74 | 27 | — |
| 5 | R1-2 | DPDM | 5 | " | — | 65 | 24 | 53 | — |
| 6 | R1-4 | " | 5 | " | 95 | 45 | 16 | 48 | — |
| 7 | R1-5 | " | 5 | " | 120 | 23 | 12 | 38 | — |

**PB maleate is identified by the experiment number (Run number) set out in Reference example 1.

What is claimed is:
1. A photo-setting composition comprising:
A. 100 weight parts of a product prepared by esterifying a maleic anhydride adduct of a liquid polybutadiene with a hydroxyl compound (i) having the formula

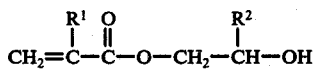

in which R¹ and R² are the same or different and each represents hydrogen or methyl, said adduct having an acid value of from 120 to 250 and a viscosity at 50° C. of from 2,000 to 100,000 centipoises;
B. 10 – 150 weight parts of one or more than one kind of unsaturated compound selected from the group consisting of
a hydroxyl compound (i), identified above, a di(meth)acrylate compound having the formula

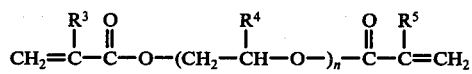

in which R³, R⁴ and R⁵ are the same or different and each represents hydrogen or methyl, and n is an integer of 1 – 4 and
a glycidyl monoester compound having the formula

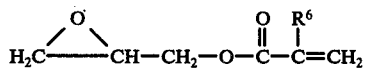

in which R⁶ represents hydrogen or methyl; and
C. 0.5 – 10 weight parts of a benzoinether compound having the formula

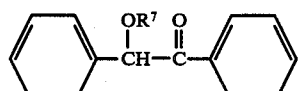

in which R⁷ represents an alkyl group containing 1 – 3 carbon atoms.

2. The photo-setting composition as claimed in claim 1 in which Component (A) has a viscosity of 200 – 100,000 centipoises at 30° C.

3. The photo-setting composition as claimed in claim 1 in which Component (B) is a hydroxyl compound having the formula

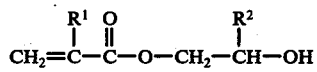

in which R¹ and R² are the same or different and each represents hydrogen or methyl.

4. The photo-setting composition as claimed in claim 1 in which Component (B) is a di(meth)acrylate compound having the formula

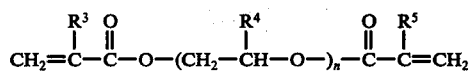

in which R³, R⁴ and R⁵ are the same or different and each represents hydrogen or methyl, and n is an integer of 1 – 4.

5. The photo-setting composition as claimed in claim 1 in which Component (B) is a glycidyl monoester having the formula

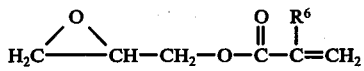

in which R⁶ represents hydrogen or methyl.

6. The photo-setting composition as claimed in claim 1 in which 20 – 110 weight parts of Component (B) are used per 100 weight parts of Component A.

7. The photo-setting composition as claimed in claim 1 in which 1 – 7 weight parts of Component (C) are used per 100 weight parts of Component (B).

8. A photo-setting composition as claimed in claim 1 in which not more than 50 weight parts of (C) Component is used per 100 weight parts of (B) Component.

9. The photo-setting composition as claimed in claim 1 in which the maleic anhydride adduct of a liquid polybutadiene has a viscosity of 2,000 – 100,000 centipoises at 50° C.

10. The photo-setting composition as claimed in claim 1 containing from about 0.005 – 1 part by weight of a thermopolymerization stabilizer per 100 parts by weight of Component (A).

* * * * *